United States Patent
Mauder et al.

(10) Patent No.: US 10,153,766 B2
(45) Date of Patent: Dec. 11, 2018

(54) SWITCH DEVICE

(71) Applicant: Infineon Technologies Austria AG, Villach (AT)

(72) Inventors: Anton Mauder, Kolbermoor (DE); Martin Gruber, Schwandorf (DE); Goran Keser, Munich (DE)

(73) Assignee: INFINEON TECHNOLOGIES AUSTRIA AG, Villach (AT)

( * ) Notice: Subject to any disclaimer, the term of this patent is extended or adjusted under 35 U.S.C. 154(b) by 0 days.

(21) Appl. No.: 15/433,447

(22) Filed: Feb. 15, 2017

(65) Prior Publication Data

US 2018/0234093 A1    Aug. 16, 2018

(51) Int. Cl.
  *H01L 23/00* (2006.01)
  *H03K 17/687* (2006.01)
  *G06F 17/50* (2006.01)

(52) U.S. Cl.
  CPC ....... *H03K 17/687* (2013.01); *G06F 17/5036* (2013.01); *H01L 24/48* (2013.01); *H01L 2924/13091* (2013.01)

(58) Field of Classification Search
  CPC .......... G06F 17/5036; H01L 24/48; H01L 2924/13091; H03K 17/687
  USPC .......... 327/419, 427, 434, 574, 581
  See application file for complete search history.

(56) References Cited

U.S. PATENT DOCUMENTS

2009/0073625 A1* 3/2009 Botti ............... H01L 23/50
                                                            361/91.1
2013/0049137 A1* 2/2013 Uno ............... H01L 27/088
                                                            257/401

FOREIGN PATENT DOCUMENTS

WO    2006136577 A1   12/2006

* cited by examiner

*Primary Examiner* — William Hernandez
(74) *Attorney, Agent, or Firm* — Slater Matsil, LLP

(57) ABSTRACT

A device is provided that includes a switch within a package. A first electrical connection is provided between a load terminal of the switch and first pin of the package, and a second electrical connection at least partially different from the first electrical connection is provided between the switch and a second pin of the package. The second pin is different from the first pin.

20 Claims, 3 Drawing Sheets

SWITCH DEVICE

TECHNICAL FIELD

The present application relates to switch devices and to methods for designing switch devices.

BACKGROUND

Switch devices are used to switch voltages or currents, for example to selectively couple a load to a voltage and/or current source, or to switch signals within a circuit. In some applications, it is desirable to measure a current flowing through the switch device. Some switch devices, also referred to as power switch devices may use transistors as switches and may be designed to switch high currents, for example several Amperes or several tens of Amperes, and/or high voltages, for example several hundred Volts. Measuring high currents may be a challenge for example in view of limiting power dissipation.

Various approaches for such current measurements have been employed. For example, a current measurement circuit, for example including a current mirror, may be integrated together with a semiconductor power switch on a single chip die. In other approaches, a current measurement circuit may be provided outside a package housing a semiconductor switch (for example a measurement resistor or measurement transformer) or may be provided within the package, but outside the chip die. Monolithically integrated approaches in some cases may not have a desired accuracy and/or may not be galvanically isolated from a load current. Approaches outside a package require corresponding space, may have high losses with associated power dissipation in case of resistors or may be comparatively expensive.

In one approach for current measurement, a magnetic field sensor device is provided within the package to measure the load current by sensing a magnetic field generated by the load current. A magnetic field sensor device may be implemented as a bridge circuit, where at least some of the elements forming the bridge circuit are magnetoresistive elements like anisotropic magnetoresistive (AMR) giant magnetoresistive (GMR) or tunneling magnetoresistive (TMR) sensor elements, or may be implemented as Hall sensor.

For generating a sufficient magnetic field to be sensed by the magnetic field sensor device, a conductor where the current is measured needs to have a certain inductivity. On the other hand, such an inductivity may reduce a switching speed to the switch device and increase losses when switching on the switch device. Furthermore, the switching speed may also depend on the load current.

SUMMARY

According to an embodiment, a device includes a package, a switch arranged in the package, the switch including a control terminal, a first load terminal and a second load terminal, where the second load terminal of the switch is connected with a first pin of the package via a first electrical connection, the second load terminal is coupled to a second pin of said package different from said first pin via a second electrical connection, and the second electrical connection is at least partially different from said first electrical connection.

According to another embodiment, a method for designing a switch device includes determining a required turn-on behavior of the switch device, and determining a tap location for an electrical connection between a load terminal of the switch device and a pin of a package depending on the required turn-on behavior.

The above summary is only intended to give a brief overview over some implementations and is not to be construed as limiting.

DETAILED DESCRIPTION OF ILLUSTRATIVE EMBODIMENTS

Figure 1:
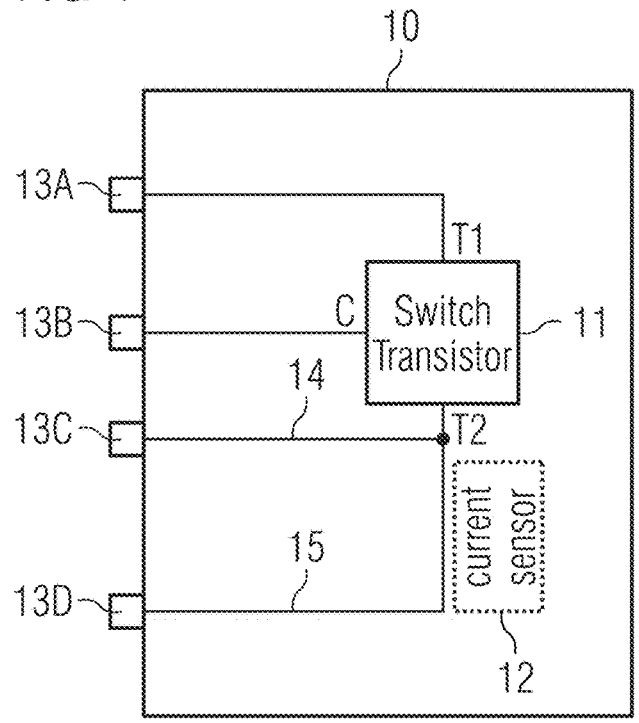
FIG. 1 is a block diagram illustrating a switch device according to an embodiment.

In the following, various embodiments will be described in detail referring to the attached drawings. It should be noted that these embodiments are given by way of example only and are not to be construed as limiting. For example, while embodiments may be described as containing numerous features or elements, in other embodiments some of these features or elements may be omitted, and/or may be replaced by alternative features or elements. Furthermore, in addition to the features or elements explicitly shown in the drawings or described herein, further features or elements may be provided, for example features or elements used in conventional switch devices like overcurrent protection, overvoltage protection or temperature monitoring.

Some embodiments includes switches. A switch generally may be described as including at least two load terminals and a control terminal. Based on a signal supplied to the control terminal, the switch is either in a closed state, also referred to as on-state, or in an open state, also referred to as off-state. In the closed state, the switch is electrically conducting between its load terminals with a low ohmic resistance and/or a low voltage drop. In the open state, the switch is essentially non-conducting between its load terminals (apart possibly from undesired leakage currents).

In some embodiments, switches may be implemented as transistors. For example, in case of a field effect transistor like a metal oxide semiconductor field effect transistor (MOSFET) the load terminals correspond to the source and drain terminals, and the control terminal corresponds to the gate terminal. In case of a bipolar junction transistor (BJT), the control terminals correspond to the collector and emitter terminals, and the control terminals correspond to the base terminals. In case of an insulated gate bipolar transistor (IGBT), the load terminals correspond to the collector and emitter terminals, and the control terminal corresponds to the gate terminal.

In some embodiments, a first electrical connection is provided from a second load terminal of a transistor to a second pin of a package. A second electrical connection is provided from the second load terminal to a second pin of the package. Examples for such configurations will be discussed further below referring to the Figures. Current sensing may be performed on the first electrical connection, for example by a magnetic field sensor device. The second electrical connection may be used in conjunction with switching the transistor, for example for applying a gate source voltage in case the second load terminal is the source terminal.

A package as used herein is a housing for one or more semiconductor chip dies. A package usually includes one or more pins to provide electrical connections. The chip dies are connected to the pins via electrical connections, for example bonding wires or other metal connections like clips.

A pin, as used herein, refers to any electrical connection of a package usable to connect a chip to the "outside world", including for example "classical" elongate pins as well as electrical connections used for example in surface mounted devices (SMD) elements or screw terminals for high current devices.

FIG. 1 illustrates a device according to an embodiment. The device of FIG. 1 includes a switch transistor 11 provided within a package 10. Switch transistor 11 may include any of the afore-mentioned types of transistors and includes a first load terminal T1, a second load terminal T2 and a control terminal C. Package 10 includes at least four pins, of which pins 13A to 13D are illustrated in FIG. 1. Further pins may be provided to offer additional electrical connections.

First load terminal T1 is electrically coupled to pin 13A, for example via a bond wire or other electrical connection.

Control terminal C is coupled to pin 13B. Second load terminal is coupled to pin 13C via a first electrical connection 14 and to pin 13D via a second electrical connection 15, the second electrical connections being at least partially different from the first electrical connection. "At least partially different" in this respect means that there may be, but need not be, a certain common electrical path, before the first electrical and second electrical connections 14, 15 "branch apart".

While terminals T1, C and T2 are shown as being directly electrically coupled to pins 13A and 13B, respectively, it should be noted that other circuitry may be provided in the electrical connections, for example ESD protection circuitry to protect switch transistor 11 from electrostatic discharge (ESD) event. In the embodiment of FIG. 1, switch transistor 11 may be controlled via pins 13B and 13C, pin 13C and first electrical connection 14 providing a "back path" for example for a current flowing when a control voltage is applied to control terminal C via pin 13B to charge/discharge control terminal C. A load current flowing from first load terminal T1 through the switch transistor 11 in a switched-on state to second load terminal will flow at least partially via second electrical connection 15. In some embodiments, first electrical connection 14 may have a lower inductivity than second electrical connection is. In other embodiments, the inductivity of first electrical connection 14 may be higher than or equal to the inductivity of second electrical connection 15. By providing a connection for the "back path" mentioned above with a comparatively low inductivity and/or which is at least partially separate from a connection carrying a load current, a fast switching with comparatively small losses may be enabled in some embodiments.

On the other hand, in an embodiment where electrical connection 15 has a sufficiently high inductivity, for example of the order of more than 10 nH, for example 10 to 30 nH, when switch transistor 11 is closed and current flows via load terminals T1, T2 between pins 13A and 13D, a magnetic field is generated which is sufficiently high to enable precise sensing by a magnetic field based current sensor like optional current sensor 12 in FIG. 1.

It should be noted that while the device of FIG. 1 includes only a single switch transistor 11, in other embodiments switch transistor 11 may be part of a greater circuit, which may also include a plurality of switch transistors and/or other circuit components.

Figure 2:
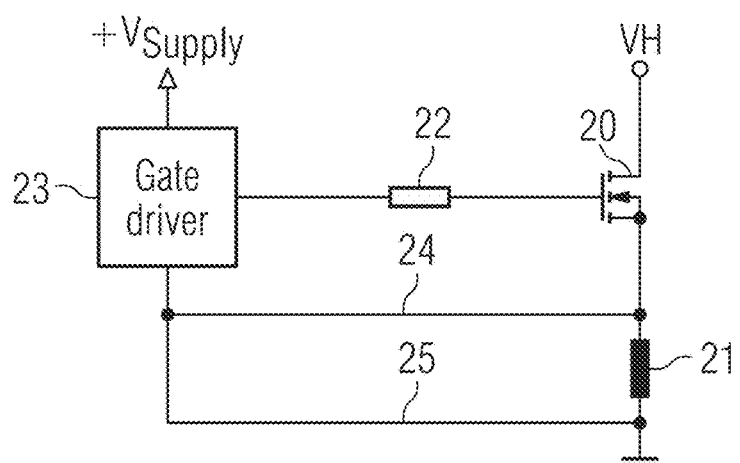
FIG. 2 is a circuit diagram for illustrating properties of switch devices according to embodiments.

The effect of an inductivity on the switching behavior of a switch transistor will now be explained referring to FIGS. 2 and 3. FIG. 2 illustrates a simple circuit used for simulations, and FIG. 3 illustrates corresponding simulation results.

In FIG. 2, a metal oxide semiconductor field effect transistor (MOSFET) 20 is controlled by a gate driver 23 via a gate resistor 22. A drain terminal of MOSFET 20 is coupled to a voltage VH, which for simulation purposes was 400 V. A gate voltage generated by gate driver 23 in an on-state may for example be 12 V for simulation purposes. Gate driver 23 is supplied by a positive supply voltage $V_{supply}$.

In some simulations, as indicated by a connection 24 a source terminal of MOSFET 20 was directly coupled to gate driver 23. For other simulations, as indicated by a connection 25, the source terminal of MOSFET 20 was coupled to gate driver 23 via an inductivity 21, which for simulation purposes was set to 15 nH. Therefore, when switching MOSFET 20, a gate source current for some simulations flows via connection 24 without inductivity 21 and for other simulations flows via connection 25 including inductivity 21. Furthermore, for simulation purposes a bias current of transistor 20 was set to 5 A. Gate resistor 22 was set to a value of 3.3Ω, and MOSFET 20 was set to an on-resistance of 60 mΩ. When switching MOSFET 20 from an off-state to an on-state by gate driver 23 applying an appropriate signal to the gate of MOSFET 20, a load current will start to flow from the drain terminal of MOSFET 20 through MOSFET 20 and inductivity 21 to a ground node. When gate driver 23 is coupled to the source terminal of MOSFET 20 via connection 25, the load current and the gate source current are sharing inductivity 21. When gate driver 23 is coupled to the source terminal of MOSFET 20 via connection 24, inductivity 21, through which the load current is flowing, is bypassed by the gate source current. It should be noted that while the values used for simulation may correspond to real values of some devices, in other device implementations these values may vary significantly, for example depending on a purpose of a switch transistor used (for example currents to be switched, voltages to be switched, circuit environment etc.). Therefore, the values are to be regarded as purely illustrative.

Figure 3:
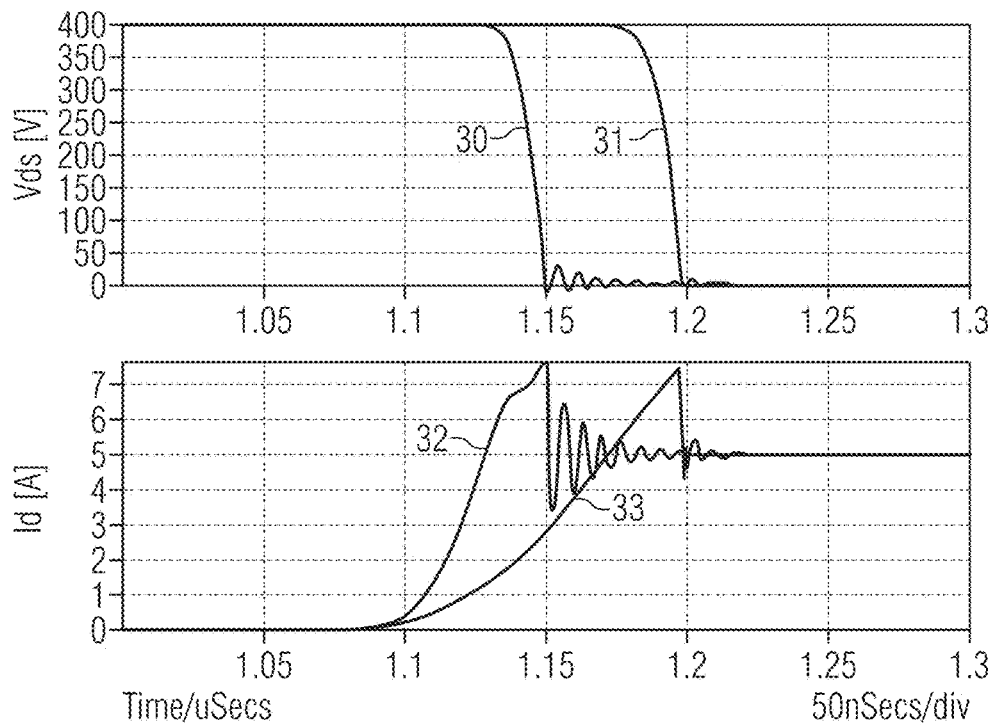
FIG. 3 illustrates simulation results for illustrating properties of switch devices according to some embodiments.

FIG. 3 illustrates simulation results when closing MOSFET 20 over time. Curves 30 and 31 illustrate the drain-source voltage VDS over time, which drops from the voltage VH=400 V to almost 0 when closing MOSFET 20, and FIG. 3 illustrates the drain current Id. Curves 30, 32 illustrate the behavior for connection 24 (without inductivity 21), and curves 31, 33 illustrate the behavior for connection 25 (including inductivity 21).

As can be seen, for connection 25 including inductivity 21, switching is considerably slower (later drop of the voltage in curve 31 compared to curve 30, and slower rise of current in curve 33 compared to curve 32). Furthermore, due to the inductivity 21, in case of connection 35 power dissipation (essentially the product of the drain-source voltage and the drain current integrated over time) in MOSFET 20 is considerably higher. In case of connection 25 the change of load current 33 at switching on MOSFET 20 causes a voltage drop at inductivity 21 which reduces the effective gate-source-voltage at MOSFET 20 thus slowing down the switching on of MOSFET 20. In case of connection 24 the effective gate-source-voltage at MOSFET 20 is defined by the gate driver 23 since inductivity 21 is bypassed for the gate driver by using connection 24. An optional, additional inductivity or parasitic inductivity in connection 24 (not shown in FIG. 2) is of minor importance since only the small gate-source current is flowing through that optional inductivity and not the large load current.

Figure 4:
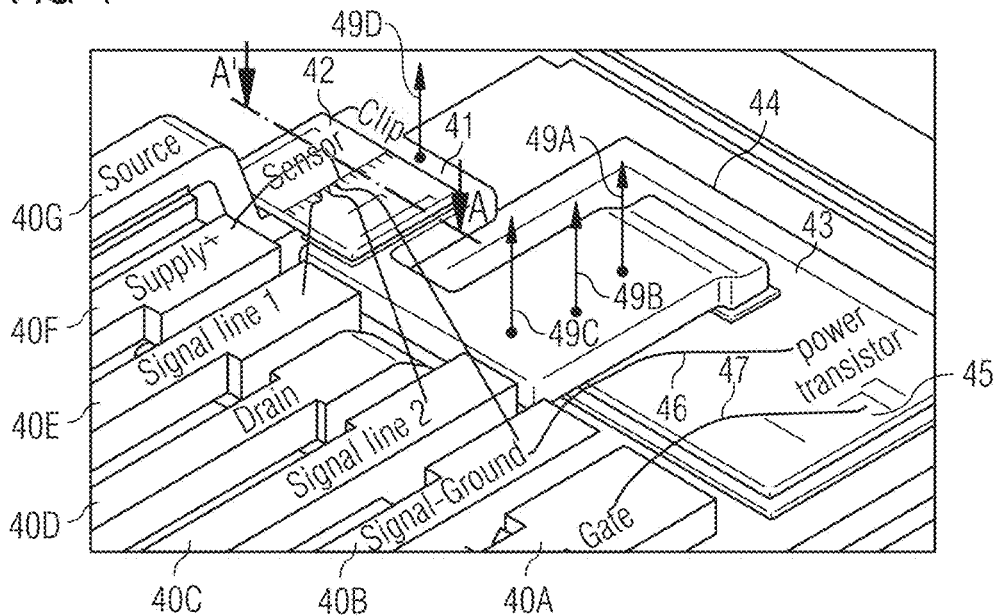
FIG. 4 is a perspective partial view of a switch device according to an embodiment.
Figure 5:
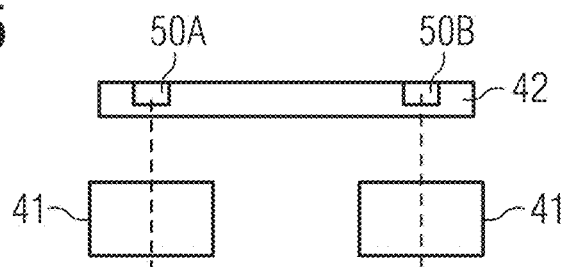
FIG. 5 is a schematic cross-section along a line A-A' in FIG. 4.

Next, for illustration purposes a device implementation according to an embodiment will be discussed referring to FIGS. 4 and 5. FIG. 4 is a partial perspective view of a device according to an embodiment, and FIG. 5 is a schematic cross-sectional view along a line A-A' in FIG. 4. The device of FIG. 4 and FIG. 5 includes a power transistor 44 chip die within a partially shown chip package. A drain of power transistor 44 located at a back side of power transistor 44 is coupled to a pin 40D, of which a portion leading to the actual pin outside the package is shown. A gate terminal contact area 45 of power transistor 44 is coupled to a pin 40A, of which again a portion leading to the actual pin outside the package is shown.

A source terminal of power transistor 44, which is provided as a large contact area 43, is coupled to a pin 40G (only partially shown) via a metal clip 41. Metal clip 41 in the embodiment shown has a U-shaped portion, on which a magnetic field sensor 42 is provided, as can be best seen in the cross-sectional view of FIG. 5. In other embodiments, a metal clip having another shape including a straight shape may be provided. Magnetic field sensor 42 may include magnetoresistive elements of which elements 50A, 50B are shown in the cross-sectional view of FIG. 5. Magnetoresistive elements 50A, 50B may be coupled in a bridge circuit together with further magnetoresistive elements (not shown in FIG. 5) or with reference resistors (not shown in FIG. 5). By using such a U-shaped clip 41 together with a bridge configuration, a tolerance against stray magnetic fields may be improved, as will be explained further below referring to FIG. 6.

As can be seen in FIG. 4, sensor 42 is coupled via bond wires to pins 40B, 40C, 40E and 40F, which again are only partially shown. Pin 40F in the embodiment of FIG. 4 serves for providing a positive supply voltage to sensor 42, pin 40B serves as ground connection, and pins 40E and 40C serve as signal lines for tapping a differential signal indicative of a magnetic field sensed and therefore of a current flowing. Providing the signal pins 40E, 40C on both sides of drain pin 40D in some embodiments may reduce the capacitive and inductive coupling behavior of a load part between source and drain on the sensor signal and therefore minimizes a common mode disturbance at best. As the signal on pins 40E, 40C is a differential signal, the common mode component is cancelled out in embodiments. Instead of bond wires in other embodiments electrical connections may be realized in other manners and may for example include bond wires, bond ribbons and/or metal bars applied e. g. by galvanic deposition or brazing of metal over a dielectric, which has an opening at the desired contact region, to give some non-limiting examples.

Figure 6:
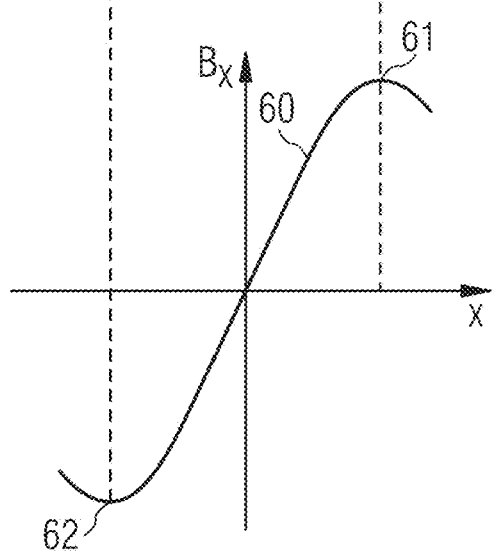
FIG. 6 is a diagram illustrating a magnetic field generated in an embodiment similar to the one shown in FIG. 4.

With the configuration on clip 41 and a bridge coupling of sensor elements 50A, 50B with the tapping of a differential signal via pins 40C, 40E, a comparatively high robustness against stray magnetic field may be obtained. To illustrate, FIG. 6 shows an example magnetic field 60 generated by current flowing through metal clip 41 as a function of a lateral position varied along a first horizontal direction x. A dot 61 indicates a component of the magnetic field vector in plane with a first surface of the sensor 42 at sensor element 50B of FIG. 5, and a dot 62 illustrates a component of the magnetic field vector in plane with a first surface of the sensor 42 at a position of sensor element 50A of FIG. 5, as indicated by dashed lines linking FIGS. 5 and 6. As can be seen, the magnetic fields have opposite signs at sensors 50A, 50B respectively. In contrast, a stray magnetic field which has only small variations on a scale corresponding to a distance between sensor elements 50A, 50B usually will have the same sign at sensor elements 50A, 50B. By a corresponding bridge circuit, or by subtracting the fields sensed by sensor elements 50A and 50B from each other, stray magnetic fields may be at least mostly cancelled out, while only the magnetic field generated by the current flowing through clip 41 essentially contributes to the measurement result.

Returning to FIG. 4, clip 41 based on its length and shape may have a comparatively high inductivity, for example more than 10 nH, e.g. between 10 and 30 nH, but not limited thereto. This may lead to a slower switching behavior, as explained above referring to FIGS. 2 and 3.

Therefore, in the embodiment of FIG. 4 an additional electrical connection 46 in form of a bond wire is provided between source terminal 43 of power transistor 44 and pin 40B. For switching power transistor 44, a gate-source voltage is then applied between pins 40A and 40B, such that a current flowing when charging or discharging a gate terminal of power transistor 44 does not flow via clip 41, but via bond wire 46. In this case, an additional voltage drop across an inductivity provided by clip 41 is not subtracted from a driving voltage of a gate driver controlling power transistor 44, and switching may be faster, as also explained referred to FIGS. 2 and 3.

It should be noted that in other embodiments a sensor may be provided on a drain connection to power transistor 44 instead of a source connection as shown in FIG. 4. However, in some embodiments providing the sensor at a source connection may reduce voltage flanks seen by the sensor.

It should be noted that in FIG. 4 pin 40B both serves as a ground pin for sensor 42 and for a connection to source via bond wire 46 for controlling power transistor 44. This in embodiments saves a pin. Nevertheless, in other embodiments separate pins may be provided.

In the embodiment of FIG. 4, an additional source connection (in addition to clip 41) is provided via bond wire 46, avoiding a feedback voltage at the inductivity provided by clip 41 during switching of power transistor 44 as explained. On the other hand, in some applications a too fast switching may be undesirable, or may lead to oscillations due to parasitic circuit components, as also shown in curves 30 and 32 of FIG. 3. Such oscillations in some applications may also be not desirable. On the other hand, a too slow switching by using only clip 41 as a source connection may also be undesirable.

To balance these requirements depending on the application, an additional source connection may in other embodiments not be tapped directly on source connection area 43 (e.g. bond wire starting, i.e. having an end at, source connection area 43) of power transistor 44 (as bond wire 46) but may be provided at any location on clip 41. Some example locations are marked by arrows and labelled 49A to 49D in FIG. 4. The common path length for load current and gate-source current provided increases from bond wire 46 to location 49A to location 49B to location 49C up to location 49D (which locations are only non-limited examples), which therefore provides a fine-tuning possibility for the described influence of the switching load current on the effective gate source voltage of power transistor 44 and therefore of the switching speed.

Figure 7:
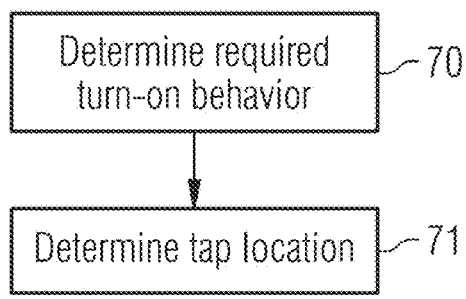
FIG. 7 is a flow chart illustrating a method according to an embodiment.

A corresponding method is shown in FIG. 7. FIG. 7 illustrates a method for designing a power device, for example the device shown in FIG. 1 or the device shown in FIG. 4. It should be noted that FIG. 7 only illustrates a part of the overall design process related to the additional load terminal (for example source) connection described herein, and the complete design process may include numerous additional acts or events, for example for designing power transistor 44, designing the form of clip 41 etc. Therefore, in addition to the acts or events shown in FIG. 7 other acts or events may be used in a method, in particular acts or events used in conventional design processes.

At 70 in FIG. 7, the method includes determining a required turn-on behavior, for example a required turn-on speed or a required absence of oscillation. At 71, based on the required behavior a tap location for an additional load terminal connection is determined, for example directly at a load terminal like a source terminal of a switch transistor (for example as bond wire 46 in FIG. 4) or anywhere on a clip or other electrical connection between the load terminal and a corresponding clip (for example anyone of locations 49A to 49D on clip 41). In this way, any value of a shared inductivity of load current and gate source current (corresponding to the shared path) may be fine-tuned to a desired value leading to the required turn-on behavior.

Some non-limiting embodiments are provided according to the following examples:

Example 1

A device, comprising:
a package; and
a switch arranged in the package, the switch comprising a control terminal, a first load terminal and a second load terminal,
wherein the second load terminal of the switch is connected with a first pin of said package via a first electrical connection, wherein said second load terminal is coupled to a second pin of said package different from said first pin via a second electrical connection, wherein the second electrical connection is at least partially different from said first electrical connection.

Example 2

The device of example 1, wherein the control terminal is electrically coupled to a third pin of said package, and the first load terminal is electrically coupled to a fourth pin of said package.

Example 3

The device of example 2, wherein the third pin and the second pin are to be coupled to a driver circuit to drive a switching of said switch.

Example 4

The device of example 2 or 3, further comprising a driver circuit driving a switching of said switch, wherein the driving circuit is coupled to said second pin and said third pin.

Example 5

The device of any one of examples 1-4, further comprising a magnetic field sensor device arranged adjacent to said first electrical connection.

Example 6

The device of example 5, wherein the first load terminal is coupled to a fourth pin, wherein the magnetic field sensor device comprises a first signal output coupled to a fifth pin and a second signal output coupled to a sixth pin, wherein the fifth and sixth pins are arranged on opposite sides of said fourth pin.

Example 7

The device of example 5 or 6, wherein the magnetic field sensor device comprises a first supply terminal and a second supply terminal, wherein the first supply terminal is coupled to a seventh pin and the second supply terminal is coupled to said second pin.

Example 8

The device of any one of examples 1-7, wherein the switch comprises a metal oxide semiconductor field effect transistor, wherein the second load terminal is a source terminal.

Example 9

The device of any one of examples 1-8, wherein said first electrical connection comprises a metal clip starting at a second load terminal contact area of a semiconductor chip die comprising the switch.

Example 10

The device of example 9, wherein the second electrical connection comprises a bond wire starting at said second load terminal contact area.

Example 11

The device of example 9 or 10, wherein the second electrical connection comprises a bond wire starting at said metal clip.

Example 12

A device, comprising:
a package;
a power switch chip die arranged within said package, the power switch chip die comprising a control terminal contact area, a first load terminal contact area and a second load terminal contact area, wherein the control terminal contact area is coupled to a first pin of the package, wherein the first load terminal contact area is coupled to a second pin of said package different from said first pin;
a metal clip coupling the second load terminal contact area to a third pin of the package,
a current sensor device provided on said metal clip; and
an electrical connection coupling the second load terminal contact area to a fourth pin different from said third pin.

Example 13

The device of example 12, wherein the current sensor device comprises a magnetic field sensor device, wherein a supply terminal of the magnetic field sensor device is coupled to said fourth pin.

Example 14

The device of example 12 or 13, wherein said electrical connection has one end at said second load terminal contact area.

Example 15

The device of any one of examples 12-14, wherein said electrical connection has one end at said metal clip.

Example 16

The device of any one of examples 12-15, wherein the current sensor device comprises first and second signal terminals coupled to fifth and sixth pins of said package, the fifths and sixth pins being arranged on opposite sides of the second pin.

Example 17

The device of any one of examples 12-16, wherein said metal clip comprises a U-shaped portion, wherein said current sensor device is provided on said U-shaped portion.

Example 18

A method for designing a switch device, the method comprising:
determining a required turn-on behavior of the switch device; and
determining a tap location for an electrical connection between a load terminal of the switch device and a pin of a package depending on the required turn-on behavior.

Example 19

The method of example 18, wherein determining the tap location comprises determining the tap location to be either on a chip die comprising a power switch or on a metal clip coupling the load terminal to another pin of the package.

Example 20

The method of example 18 or 19, further comprising determining the tap location depending on an inductivity associated with the required turn-on behavior.

While specific examples have been described above, these serve illustrative purposes only and are not to be construed as limiting.

What is claimed is:

1. A device, comprising:
a package; and
a switch arranged in the package, the switch comprising a control terminal, a first load terminal and a second load terminal, wherein the second load terminal of the switch is connected with a first pin of said package via a first electrical connection, wherein said second load terminal is coupled to a second pin of said package different from said first pin via a second electrical connection, wherein the second electrical connection is at least partially different from said first electrical connection; and
a magnetic field sensor device arranged adjacent to said first electrical connection.

2. The device of claim 1, wherein the control terminal is electrically coupled to a third pin of said package, and the first load terminal is electrically coupled to a fourth pin of said package.

3. The device of claim 2, wherein the third pin and the second pin are configured to be coupled to a driver circuit to drive a switching of said switch.

4. The device of claim 2, further comprising a driver circuit driving a switching of said switch, wherein the driver circuit is coupled to said second pin and said third pin.

5. The device of claim 1, wherein the first load terminal is coupled to a fourth pin, wherein the magnetic field sensor device comprises a first signal output coupled to a fifth pin and a second signal output coupled to a sixth pin, wherein the fifth and sixth pins are arranged on opposite sides of said fourth pin.

6. The device of claim 1, wherein the magnetic field sensor device comprises a first supply terminal and a second supply terminal, wherein the first supply terminal is coupled to a seventh pin and the second supply terminal is coupled to said second pin.

7. The device of claim 1, wherein the switch comprises a metal oxide semiconductor field effect transistor, wherein the second load terminal is a source terminal.

8. A device, comprising:
a package; and
a switch arranged in the package, the switch comprising a control terminal, a first load terminal and a second load terminal,
wherein the second load terminal of the switch is connected with a first pin of said package via a first electrical connection, wherein said second load terminal is coupled to a second pin of said package different from said first pin via a second electrical connection, wherein the second electrical connection is at least partially different from said first electrical connection, and
wherein said first electrical connection comprises a metal clip starting at a second load terminal contact area of a semiconductor chip die comprising the switch.

9. The device of claim 8, wherein the second electrical connection comprises a bond wire starting at said second load terminal contact area.

10. The device of claim 8, wherein the second electrical connection comprises a bond wire starting at said metal clip.

11. A device, comprising:
a package;
a power switch chip die arranged within said package, the power switch chip die comprising a control terminal contact area, a first load terminal contact area and a second load terminal contact area, wherein the control terminal contact area is coupled to a first pin of the package, wherein the first load terminal contact area is coupled to a second pin of said package different from said first pin;
a metal clip coupling the second load terminal contact area to a third pin of the package,
a current sensor device provided on said metal clip; and
an electrical connection coupling the second load terminal contact area to a fourth pin different from said third pin.

12. The device of claim 11, wherein the current sensor device comprises a magnetic field sensor device, wherein a supply terminal of the magnetic field sensor device is coupled to said fourth pin.

13. The device of claim 11, wherein said electrical connection has one end at said second load terminal contact area.

14. The device of claim 11, wherein said electrical connection has one end at said metal clip.

15. The device of claim 11, wherein the current sensor device comprises first and second signal terminals coupled to fifth and sixth pins of said package, the fifth and sixth pins being arranged on opposite sides of the second pin.

16. The device of claim 11, wherein said metal clip comprises a U-shaped portion, wherein said current sensor device is provided on said U-shaped portion.

17. A method for manufacturing a switch device, the method comprising:

arranging a power switch chip die in a package, the power switch chip die comprising a control terminal, a first load terminal and a second load terminal, the power switch chip die comprising a control terminal contact area, a first load terminal contact area and a second load terminal contact area;

coupling the control terminal contact area to a first pin of the package;

coupling the first load terminal contact area to a second pin of the package different from the first pin of the package;

coupling a metal clip between the second load terminal contact area and a third pin of the package; and coupling the second load terminal contact area to a fourth pin different from the third pin.

18. The method of claim 17, wherein coupling the second load terminal contact area to the fourth pin comprises coupling the second load terminal contact area to a first location on the metal clip between the second load terminal contact area and the third pin of the package.

19. The method of claim 18, wherein the first location is based on a required turn-on behavior of the switch device and an inductivity associated with the required turn-on behavior.

20. The method of claim 17, further attaching a current sensor device on the metal clip.

* * * * *